United States Patent
Nishimura et al.

(10) Patent No.: US 6,181,637 B1
(45) Date of Patent: Jan. 30, 2001

(54) MEMORY DEVICE

(75) Inventors: Koichi Nishimura; Atsushi Hatakeyama, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/523,307

(22) Filed: Mar. 10, 2000

(30) Foreign Application Priority Data

Mar. 26, 1999 (JP) .................................................. 11-083618

(51) Int. Cl.[7] .................................................. G11C 8/00
(52) U.S. Cl. ...................................... 365/230.06; 365/194
(58) Field of Search .......................... 365/230.06, 189.11, 365/194

(56) References Cited

U.S. PATENT DOCUMENTS

| | | | |
|---|---|---|---|
| 5,475,638 | * 12/1995 | Anami et al. | 365/189.11 |
| 5,493,241 | * 2/1996 | Landry et al. | 326/105 |
| 5,673,229 | * 9/1997 | Okamura et al. | 365/201 |
| 5,949,737 | * 9/1999 | Casper et al. | 365/230.06 |
| 5,978,308 | * 11/1999 | Kato | 365/230.06 |
| 6,009,023 | * 12/1999 | Lu et al. | 365/189.11 |

* cited by examiner

*Primary Examiner*—Son T. Dinh
(74) *Attorney, Agent, or Firm*—Arent Fox Kintner Plotkin & Kahn, PLLC (57) ABSTRACT

A memory device having memory cells at cross sections of word lines and bit lines, a word-line driver for driving the word lines in response to a first activation signal, a delay circuit for generating a second activation signal that delays the first activation signal, and a sense amp for amplifying the voltage read from the memory cell in response to the second activation signal, comprises: a first power-supply voltage that is supplied to the word-line driver, and a second power-supply voltage that is supplied to the delay circuit, where the second power-supply voltage is generated from the first power-supply voltage.

In the present invention, there is a first power-supply voltage that is supplied to the word-line driver, and a second power-supply voltage that is supplied to the delay circuit. And since the second power-supply voltage is generated from the first power-supply voltage, the delay time of the delay circuit is depending on the first power-supply voltage, but does not depend on the external power supply voltage. In addition, the activation timing of the sense amp does not become faster due to fluctuations of the external power-supply voltage, and since it is possible to stably maintain the required WL–LE interval, it is possible to operate the memory properly without an increase in power consumption of the memory device.

6 Claims, 10 Drawing Sheets

FIG. 1

Memory Device Structure

FIG. 9
Memory Device Structure

Vdd < Vpp

FIG. 13

Vdd > Vpp

MEMORY DEVICE

BACKGROUND OF THE INVENTION

1. Field of the Invention

This invention relates to a memory device of which the activation timing of the sense amp is adequately controlled.

2. Description of the Prior Art

Figure 9:
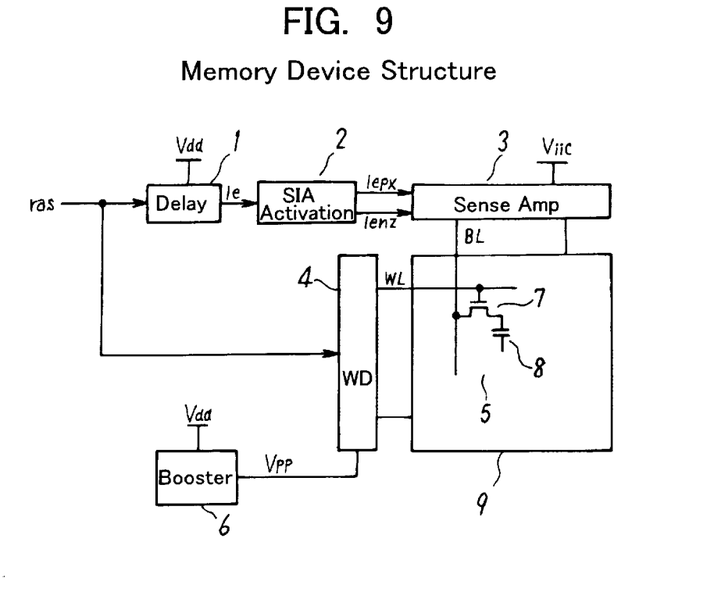
FIG. 9 is a schematic diagram of the prior memory device.

FIG. 9 is an outline drawing of a prior art memory device. The prior art memory device comprises a memory cell 5 in which an NMOS transistor 7 and capacitor 8 are located at the point of intersection of a word line WL and bit line BL, a word-line driver 4 which activates the word line WL in response to a row address strobe ras (row activation signal), a sense amp 3 which reads and amplifies the electric potential difference between the bit line BL,/BL during reading and writing of the memory cell, a delay circuit 1 which applies a specified delay time to the row address strobe ras, and generates a latch-enable signal le, a sense-amp activation circuit 2 which generates sense-amp activation signals lepx, lenz from the latch-enable signal le, and a boost-up circuit 6 which generates a boosted power-supply voltage Vpp from an external power-supply voltage Vdd.

When a row address strobe ras is input to the wordline driver 4 from the CPU or memory controller (not shown in the figure), the potential of the word line WL rises, the NMOS transistor 7 begins to conduct, and voltage corresponding to the data held in the capacitor 8 is applied to the bit line BL.

Next, the sense-amp activation signals lepx, lenz are output at the timing of the occurrence of a very small potential difference between the bit lines BL,/BL, and the sense amp 3 is activated. The sense amp 3 reads and amplifies the potential difference between the bit lines BL,/BL.

Figure 10:
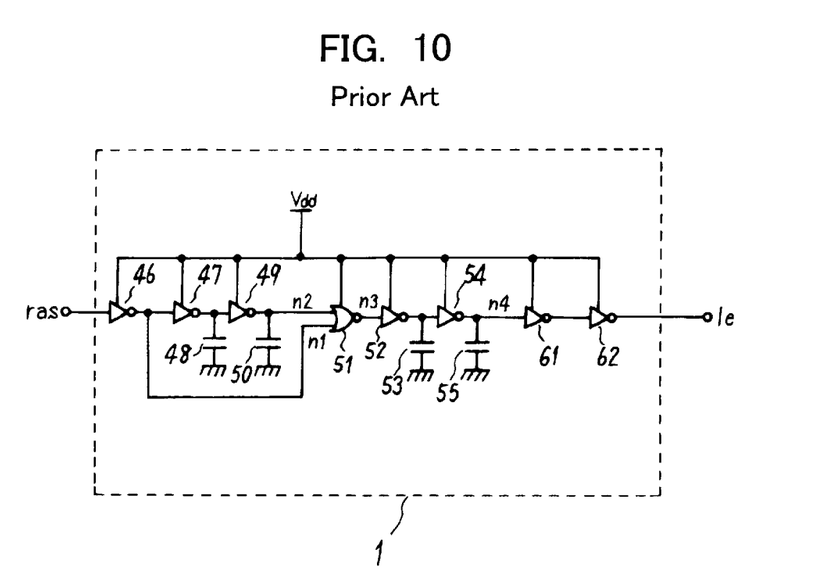
FIG. 10 is a schematic diagram of the prior delay circuit.

FIG. 10 is a schematic drawing of a delay circuit 1 in a prior art memory device. The delay circuit 1 comprises inverters 46, 47, 49, 52, 54, 61, 62, a NOR circuit 51 and capacitors 48, 50, 53, 55, and an external power-supply voltage Vdd is supplied as the driving power-supply of the inverters 46, 47, 49, 52, 54, 61, 62 and NOR circuit 51.

The delay time of the delay circuit 1 is set to a value such that an interval (WL–LE) can be maintained between the activation timing of word line WL and the activation timing of the sense amp 3. In this way it is possible to activate the sense amp 3 at proper timing when the small potential difference occurs between the bit lines BL,/BL.

Figure 11:
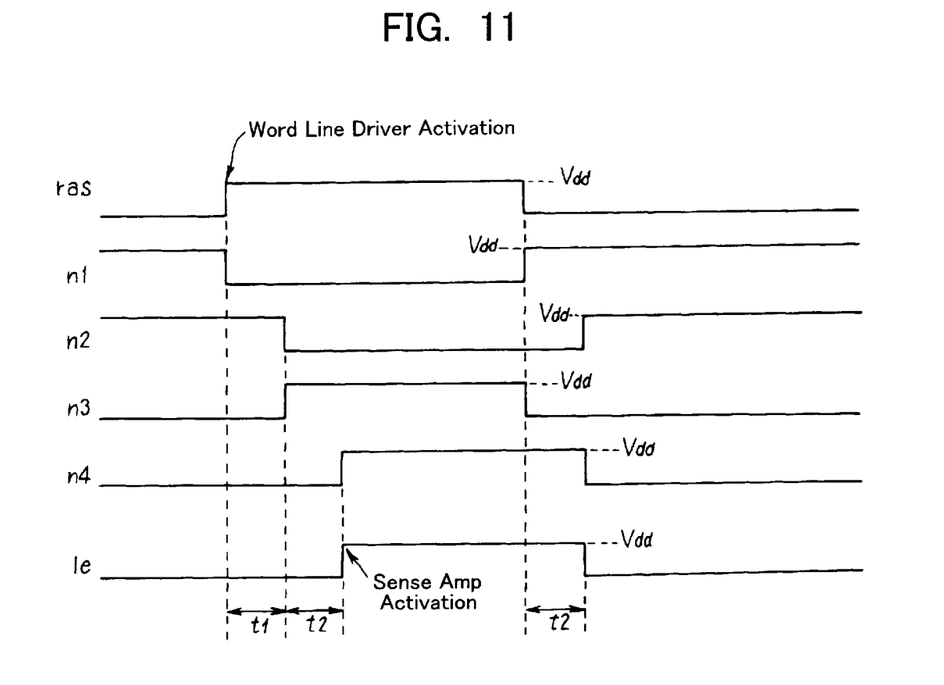
FIG. 11 is a timing chart for operation of the prior delay circuit.

FIG. 11 is a timing chart of the operation of the delay circuit 1. When the row address strobe ras becomes high, the word-line driver 4 is activated as described above, and the potential of the word line WL rises. On the other hand, the row address strobe ras is inverted by the inverter 46 in the delay circuit 1, and becomes the signal at node n1, and a delay of time t1 is applied by inverters 47, 49 and capacitors 48, 50 to become the signal at node n2.

The signal at node n1 and the signal at node n2 are input to the NOR circuit 51 and become the signal at node n3, and a further delay of time t2 is applied by inverters 52, 54 and capacitors 53, 55 to become the signal at node n4. The waveform of the signal at node n4 is shaped by inverters 61, 62 to become the latch-enable signal le. When the level of this latch-enable signal le becomes high, the sense amp 3 is activated. The delay time of the delay circuit 1 in this case is (t1+t2).

Figure 12:
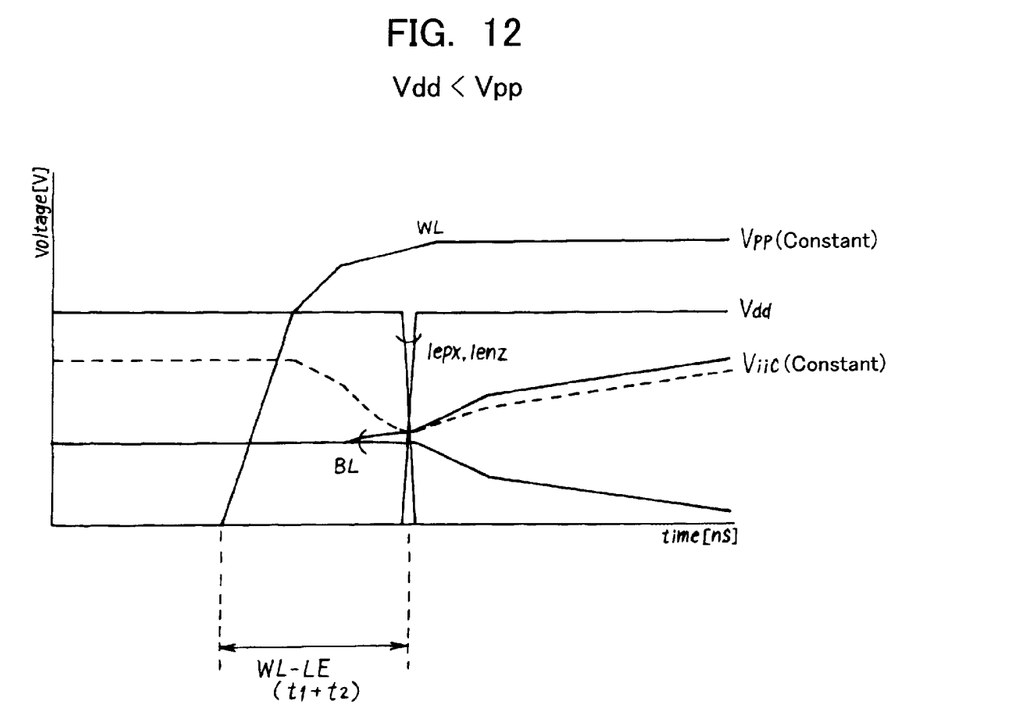
FIG. 12 is a diagram which shows the waveform of the prior memory cell when operating under normal conditions.

FIG. 12 shows the waveform of the memory cell 5 during operation under normal conditions when the external power-supply voltage Vdd is less than the boosted power-supply voltage Vpp. When the row address strobe ras is input, the potential of the word line WL rises. The boosted power-supply voltage Vpp is applied to the word line WL, so the potential of the word line WL rises at a slope that corresponds to the voltage level of the boosted power-supply voltage Vpp.

When the potential of the word line WL rises, the NMOS transistor 7 of the memory cell 5 begins to conduct, and the charge of the capacitor 8 is discharged to the bit line BL. The change in the charging voltage of the capacitor 8 is shown by the dotted line. A potential difference begins to occur between the bit lines BL,/BL as the charge is discharged from the capacitor 8.

After the potential of the word line WL has risen, the delay time (t1+t2) of the delay circuit 1 is set to correspond with time required for a potential difference, that can be amplified by the sense amp 3, to occur in the bit lines BL,/BL. This time is the aforementioned interval WL–LE.

At the timing when there is a sufficient potential difference in the bit lines BL,/BL, the sense-amp activation signals lepx, lenz are input to the sense amp, and the sense amp reads and amplifies the potential difference in the bit lines BL,/BL. Since the external power-supply voltage Vdd is applied to the delay circuit 1, the delay time (t1+t2) of the delay circuit 1 changes depending on the external power-supply voltage Vdd.

As described above, the boosted power-supply voltage Vpp that raised the external power-supply voltage Vdd is applied to the word line driver 4, and the word line WL is driven by the boosted power-supply voltage Vpp. This is done in order that high voltage is applied to the gate of the NMOS transistor 7 of the memory cell 5 so that the NMOS transistor 7 conducts sufficiently. Moreover, in order to reduce the power consumed, the cell step-down power-supply voltage Viic that is lowered from the external power-supply voltage Vdd is applied to the memory cell 5 by way of the sense amp.

When this happens, the boosted power-supply voltage Vpp or the cell step-down power-supply voltage Viic is the constant voltage that is generated inside the memory device so the effect due to fluctuations of the external power-supply voltage Vdd is small. Also, since the necessary WL–LE interval for memory operation is determined by the voltage level of the boosted power-supply voltage Vpp and cell step-down power-supply voltage Viic, it does not change even if the external power-supply voltage changes.

On the other hand, the external power-supply voltage Vdd is supplied to the delay circuit 1 as shown in FIG. 10. There are two main reasons that the external power-supply voltage Vdd is used as the power supply for the delay circuit 1 instead of the boosted power-supply voltage Vpp.

(1) The converting efficiency of the boost-up circuit 6 that generates the boosted power-supply voltage Vpp from the external power-supply voltage Vdd is 30 to 50%, and since it consumes more power than the amount supplied to the load side, from the aspect of lowering the power consumption, it is necessary to restrict the destination to which the boosted power-supply voltage Vpp is supplied.

(2) Constantly applying a high voltage, such as the boosted power supply voltage Vpp, to components of the delay circuit 1 such as the inverter 46, shortens the life of components such as the inverter 46 due to the large stress voltage, and so it is not desirable.

The external power-supply voltage Vdd is supplied to the delay circuit 1 in the prior art because of the above reasons.

In this case, the voltage level of the external power-supply voltage Vdd easily changes depending on the model of external power supply used, and when the external power-supply voltage Vdd changes to become high, the slope of the signal amplitude of the inverter 46 becomes steep and the delay time (t1+t2) of the delay circuit 1 becomes short.

Figure 13:
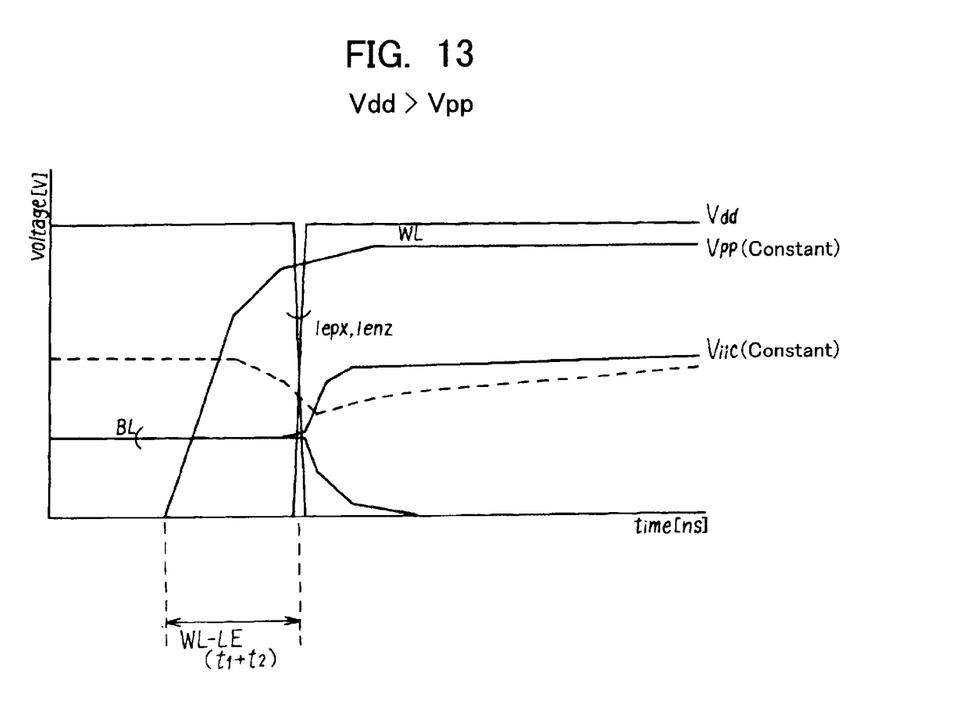
FIG. 13 is a diagram which shows the waveform of the prior memory cell.

FIG. 13 shows the operating waveform of the memory cell 5 when the external power-supply voltage Vdd becomes larger than the boosted power-supply voltage Vpp. As shown in FIG. 13, when the external power-supply voltage Vdd is set to be high, the delay time (t1+t2) of the delay circuit 1 becomes short, and the output timing of the sense amp activation signals lepx, lenz becomes faster and the WL–LE interval becomes shorter. When this happens, the sense amp 3 is activated before enough potential difference can be generated between the bit lines BL,/BL, and so the memory cannot operate properly.

A method is feasible where the WL–LE interval could be maintained by installing a constant-voltage power supply for the delay circuit 1 regardless of whether or not the external power-supply voltage Vdd varies. However, this method is not desirable because it would increase the power consumption of the memory device.

SUMMARY OF THE INVENTION

It is an objective of the present invention to provide a memory device that is capable of maintaining the necessary WL–LE interval without increasing the power consumption even if the external power-supply voltage Vdd changes.

The aforementioned objective is accomplished by providing a memory device comprising:

memory cells provided at cross sections of word lines and bit lines;

a word-line driver receiving a first power-supply voltage for driving the word lines in response to a first activation signal;

a delay circuit receiving a second power-supply voltage for generating a second activation signal that delays the first activation signal;

and a sense amplifier for amplifying the voltage read from the memory cell in response to the second activation signal;

wherein the second power-supply voltage is generated from the first power-supply voltage.

In the present invention, there is a first power-supply voltage that is supplied to the word-line driver, and a second power-supply voltage that is supplied to the delay circuit. And since the second power-supply voltage is generated from the first power-supply voltage, the delay time of the delay circuit is depending on the first power-supply voltage, but does not depend on the external power supply voltage. In addition, the activation timing of the sense amp does not become faster due to fluctuations of the external power-supply voltage, and since it is possible to stably maintain the required WL–LE interval, it is possible to operate the memory properly without an increase in power consumption of the memory device.

Moreover, the aforementioned second power-supply voltage in the memory device of this invention is generated from a transistor in which the external power-supply voltage is supplied to its drain and the first power-supply voltage is supplied to its gate.

In the present invention, since the second power-supply voltage is generated from a transistor in which the external power-supply voltage is supplied to its drain and the first power-supply voltage is supplied to its gate, it is possible to keep the second power-supply voltage that is supplied to the delay circuit below the value of the first power-supply voltage minus the threshold voltage of the transistor even when the external power-supply voltage becomes high.

Furthermore, since the delay time of the delay circuit does not become shorter than the time that corresponds to the value of the first power-supply voltage minus the threshold value of the transistor, and since it is possible to maintain the required WL–LE interval regardless of fluctuations in the external power-supply voltage, it is possible to operate the memory properly without an increase in power consumption of the memory device.

DETAILED DESCRIPTION OF THE PREFERRED EMBODIMENT

The preferred embodiment of the present invention will be explained in reference to the drawings. However, the embodiment is not limited to the technical scope of the present invention.

Figure 1:
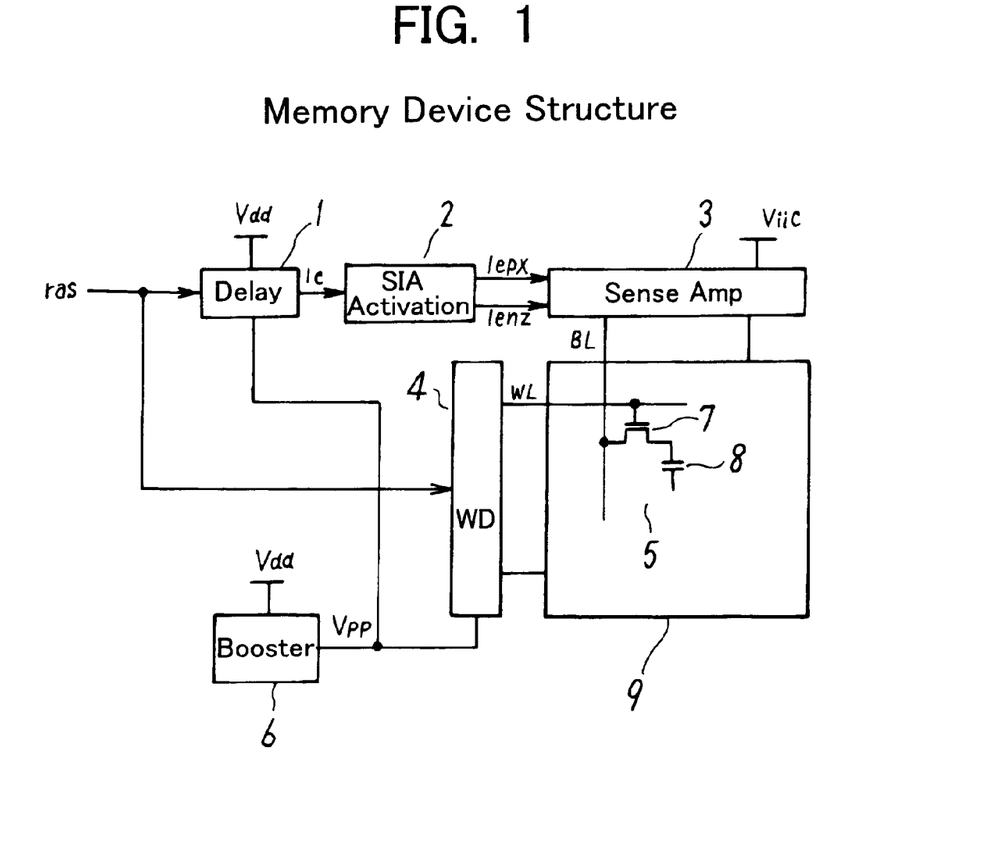
FIG. 1 is a schematic diagram of the memory device of this invention.

FIG. 1 is a schematic diagram showing a memory device, such as a DRAM, of the present invention. The memory device of this invention comprises: a memory cell 5 having a NMOS transistor 7 and capacitor 8 and located at the point where the word line WL crosses the bit line BL, a word-line driver 4 that activates the word line WL in response to the row address strobe ras, a sense amp 3 that reads and amplifies the potential difference between the bit lines BL,/BL during the read/write operation of the memory cell 5, a delay circuit 1 that generates a latch enable signal le by applying a specified delay time to the row address strobe ras, a sense amp activation circuit 2 that generates sense amp activation signals lepx, lenz from the latch enable signal le, and a boost-up circuit 6 that generates a boosted power-supply voltage Vpp from the external power-supply voltage Vdd.

When a row address strobe ras is input from the memory controller (not shown in the figure) to the word-line driver 4, the potential of the word line WL rises, and voltage corresponding to the data held in the capacitor 8 is applied to the bit lines BL,/BL. At the timing when a very small potential difference occurs in the bit lines BL,/BL, the sense amp activation signals lepx, lenz are activated and the sense amp 3 reads and amplifies the potential difference between the bit lines BL,/BL.

Figure 2:
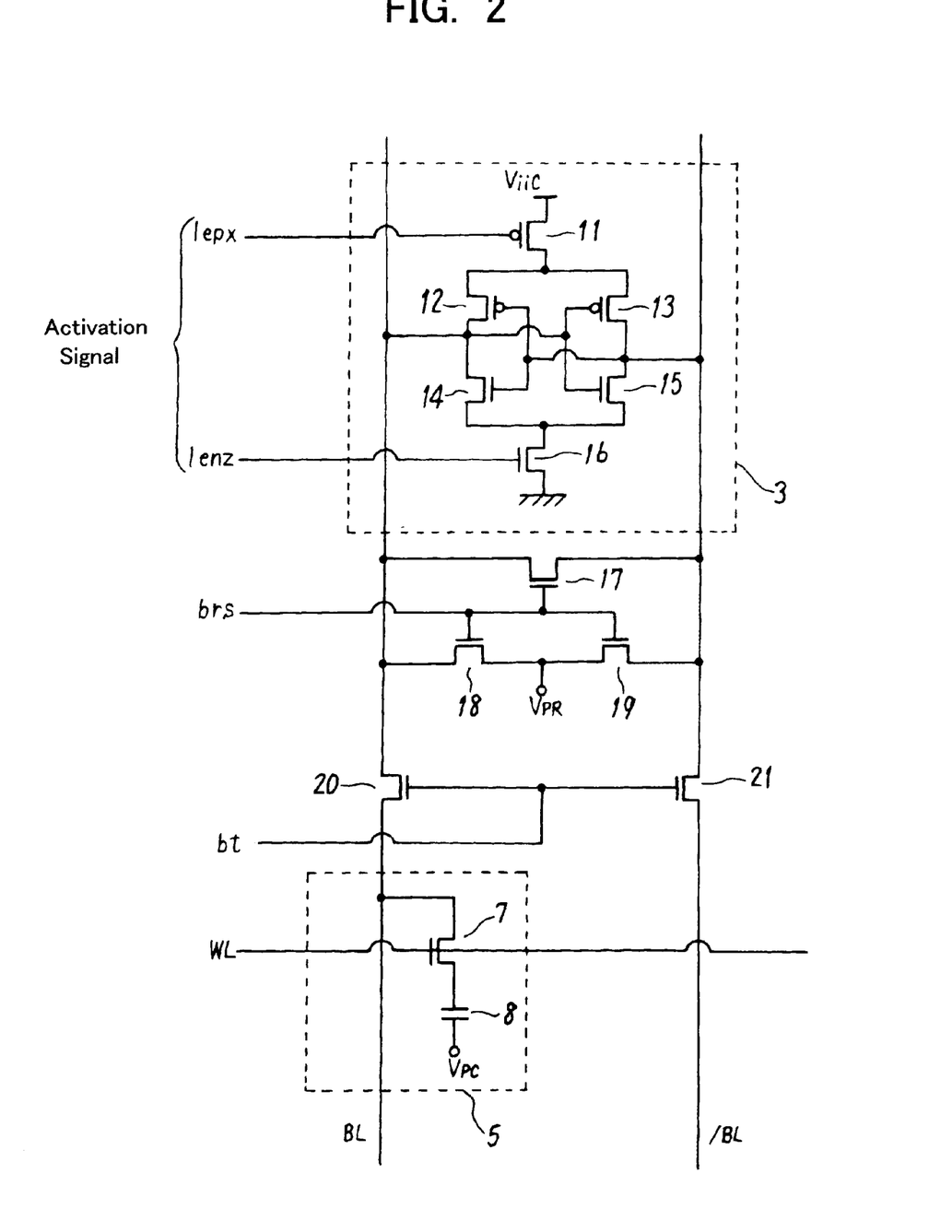
FIG. 2 is a schematic diagram of the sense amp and memory cell of this invention.

FIG. 2 is a schematic diagram of the memory cell 5 and sense amp 3 of this invention. The memory cell is constructed with a NMOS transistor 7 and capacitor 8, that are located at the point where the word line WL crosses the bit line BL. A voltage Vpc for the electrode facing the cell is applied to the one electrode of the capacitor 8.

The sense amp 3 is constructed with PMOS transistors 11, 12, 13 and NMOS transistors 14, 15, 16, and it is connected to the cell step-down power-supply voltage Viic by way of the PMOS transistor 11, and is grounded by way of the NMOS transistor 16. The cell step-down power-supply voltage Viic is a constant voltage for reducing the power consumption of the memory cell 5 while storing data and is generated by lowering the external power-supply voltage Vdd.

A pre-charge circuit made from NMOS transistors 17, 18, 19 is connected between the bit lines BL,/BL, and a pre-charge voltage Vpr is applied at a point connecting the NMOS transistors 18, 19. When the DRAM is in standby status, the NMOS transistors 17, 18, 19 become conductive by activating (H level) the bit-line control signal brs, and this short circuits the bit lines BL,/BL, and by applying the pre-charge voltage Vpr, the pre-charge operation is performed.

When the DRAM becomes active, the bit-line control signal brs is deactivated (L level), and the transfer gate control signal by is activated (H level), the NMOS transistors 20, 21 become conductive and the bit lines BL,/BL become connected to the sense amp 3. The potential of the word line WL then rises and a voltage corresponding to the data held in the capacitor 8 is applied to the bit lines BL,/BL.

At the timing when a very small potential difference occurs between the bit lines BL,/BL, sense amp activation signals lepx, lenz are input to the gate of the PMOS transistor 11 and the NMOS transistor 16, and the sense amp 3 is activated. After being activated, the sense amp reads and amplifies the potential difference between the bit lines BL,/BL.

Figure 3A:
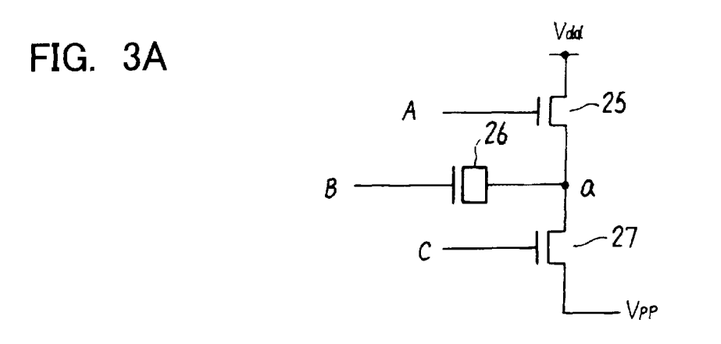
FIGS. 3A–3C are diagrams that explains the step-up circuit of this invention.

FIG. 3 is a diagram explaining the boost-up circuit 6 of the present invention. The boost-up circuit of this invention, as shown in FIG. 3A, is constructed with NMOS transistors 25, 27 and a capacitor 26, where the drain of the NMOS transistor 25 is connected to the external power-supply voltage Vdd, and the source of the NMOS transistor 27 is connected to the boosted power-supply voltage Vpp.

Figure 3B:
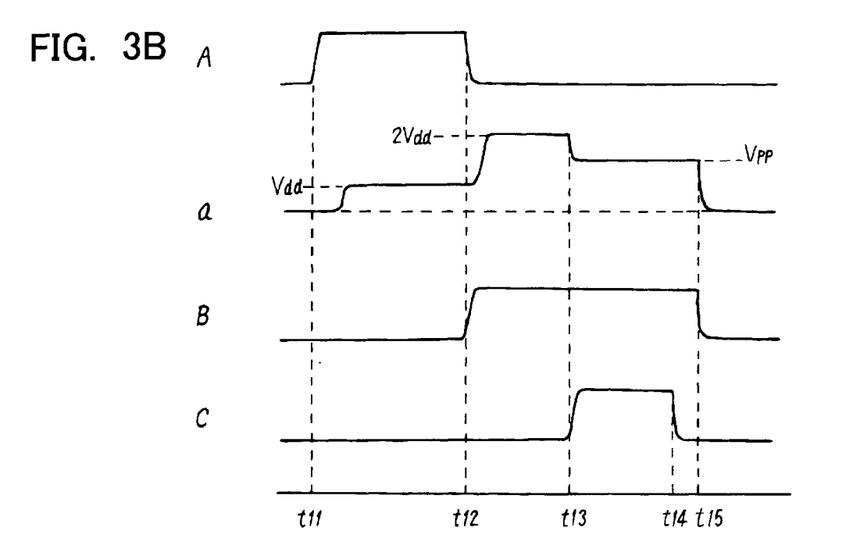

As shown in FIG. 3B, when a signal A is input at the gate of the NMOS transistor 25 at time t11, the NMOS transistor 25 becomes conductive, and node a becomes equal to the external power-supply voltage Vdd, and the capacitor is charged by the external power-supply voltage Vdd. At time t12, the signal A goes OFF, and when a signal B, whose amplitude is equal to that of the external power-supply voltage Vdd, is applied to the capacitor 26, the potential of node a becomes approximately twice Vdd.

Next, at time t13, when a signal C is input at the gate of the NMOS transistor 27, the NMOS transistor 27 becomes conductive, and node a becomes connected to the boosted power-supply line and raises the boosted power-supply voltage Vpp. At time t14 and time t15, signal C and signal B go OFF, and the boosted power-supply voltage Vpp drops due to discharge, however by repeatedly applying signals A, B and C, it is possible to keep the boosted power-supply voltage Vpp constant.

Figure 3C:
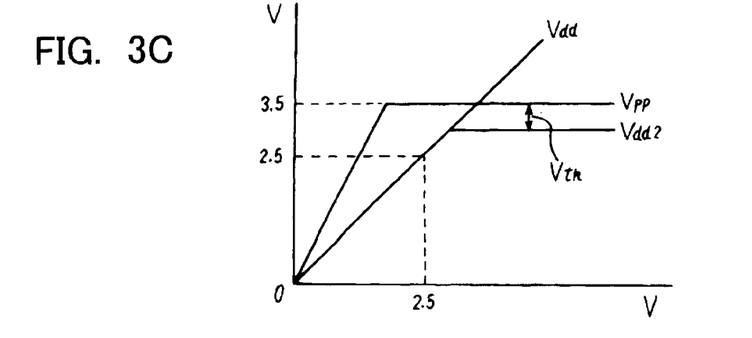

FIG. 3C shows the relationship between the external power-supply voltage Vdd and the boosted power-supply Vpp. In the boost-up circuit 6 of this embodiment, when the external power-supply voltage Vdd=2.5 V, for example, the external power-supply voltage Vdd is raised one step, and the boosted power-supply voltage Vpp=3.5 V. The voltage Vdd2 shown in FIG. 3C is the voltage which drives the delay circuit 1, to be described later.

Figure 4A:
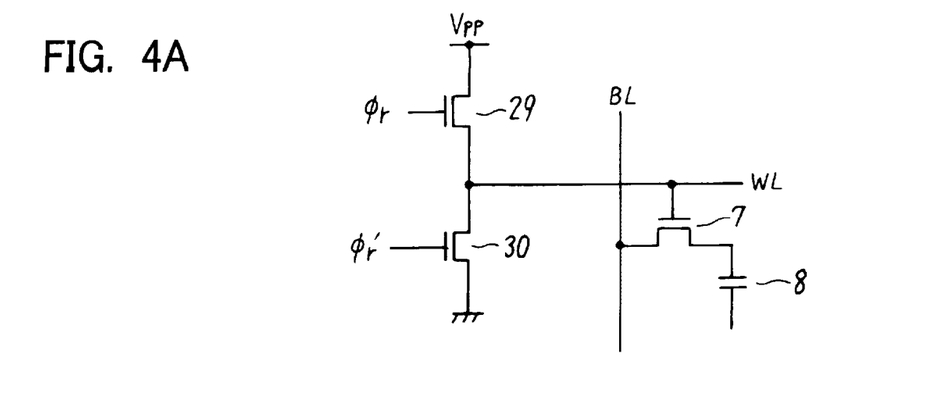
FIGS. 4A–4B are schematic diagrams of the word-line driver of this invention.

FIG. 4 is a schematic diagram of the word-line driver 4 of this embodiment. As shown in FIG. 4A, the word-line driver 4 is constructed with an NMOS transistor 29 and NMOS transistor 30, where the drain of the NMOS transistor 29 is connected to the boosted power-supply voltage (first power supply voltage) Vpp, and the source of the NMOS transistor 30 is connected to ground. Moreover, at the timing of the row address strobe 'ras', which is a decoded selected signal, the generated signals, φr and φr' are input to the gates of the NMOS transistors 29 and 30.

When signal φr becomes high (H level), the NMOS transistor 30 conducts, the boosted power-supply voltage Vdd is applied to the word line WL, the NMOS transistor 7 of the memory cell conducts and the data voltage of the capacitor 8 is read by the bit line BL.

Figure 4B:
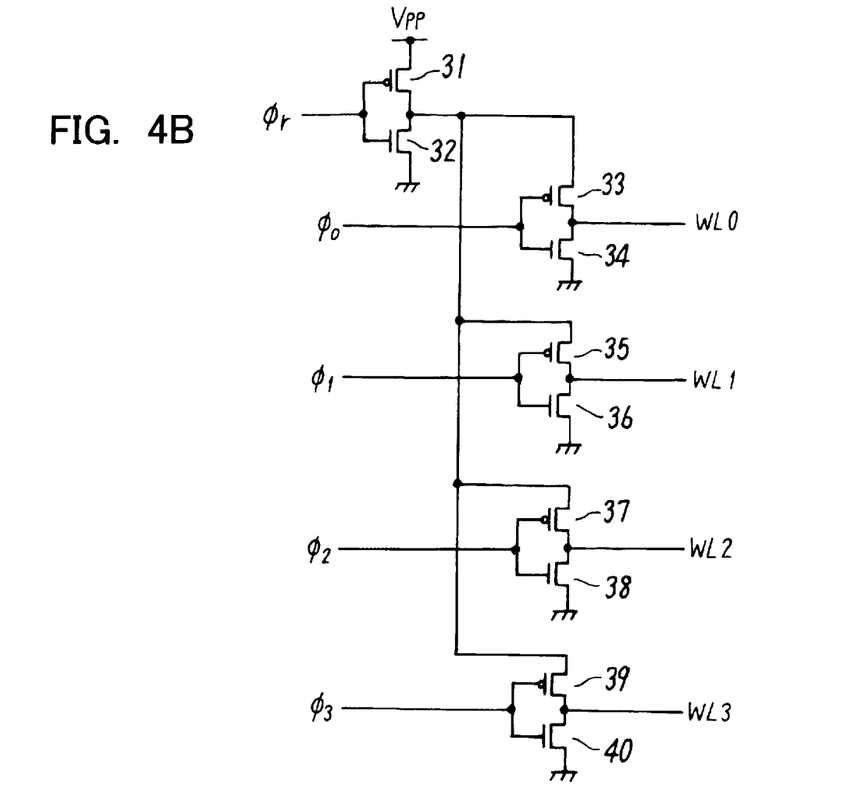

FIG. 4B shows a word-line driver 4 with a decoder function, and it is constructed with PMOS transistors 31, 33, 35, 37, 39 and NMOS transistors 32, 34, 38, 40. When the signal φr is activated, the boosted power-supply voltage Vpp is applied to the word lines WL0 to WL3 that are selected by the decode signals φ0 to φ3, and the corresponding data voltage is read by the bit line BL.

On the other hand, as described above, in order to amplify the potential difference of the bit lines BL,/BL with the sense amp 3 to the value required for memory operation, a sufficient interval (WL–LE) between the activation timing of the word line WL and the activation timing of the sense amp 3 must be maintained. In other words, it is necessary that the interval WL–LE is not decreased due to fluctuations in the external power-supply voltage Vdd, as occurred in the prior art, and is necessary to activate the sense amp 3 after a sufficient potential difference occurs between the bit lines BL,/BL by the charge held in the memory cell 5.

In the DRAM of this embodiment of the present invention, the delay time of the delay circuit 1 is not allowed to become shorter due to fluctuations of the external power-supply voltage Vdd, and the interval WL–LE is sufficiently maintained regardless of the fluctuation in the external power-supply voltage Vdd.

Figure 5:
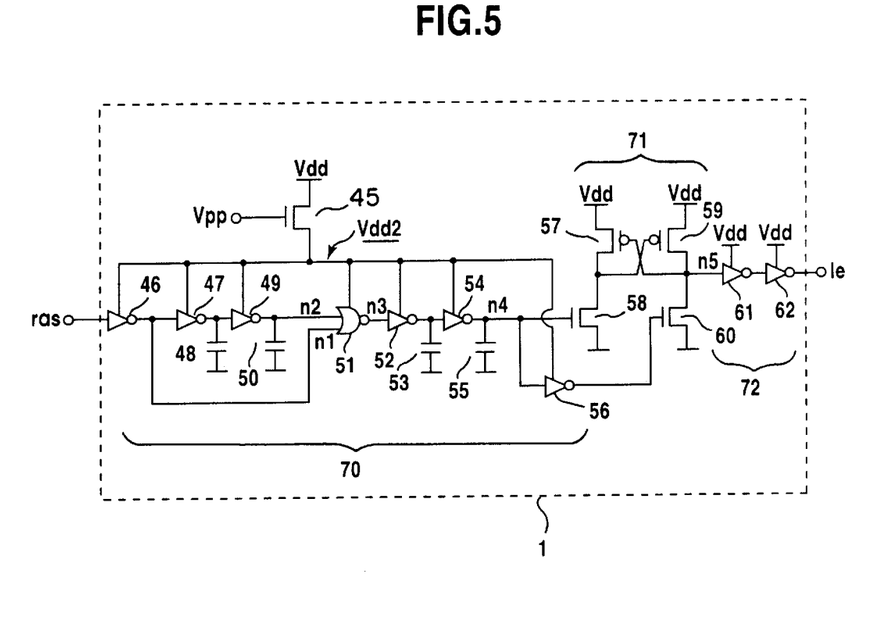
FIG. 5 is a schematic diagram of the delay circuit of this invention.

FIG. 5 is a schematic diagram of the delay circuit 1 of this embodiment of the present invention. The delay circuit 1 of this embodiment comprises a delay time generator 70 that is constructed with inverters 46, 47, 49, 52, 54, 56, NOR circuit 51, and capacitors 48, 50, 53, 55, and NMOS transistor 45 in which the external power-supply voltage Vdd is supplied to its drain, and which supplies a driving voltage (second power supply voltage) Vdd2 to the delay time generator 70. Moreover, it comprises a level converter 71 that is constructed with PMOS transistors 57, 59 and NMOS transistors 58, 60 and which converts the signal amplitude from Vdd2 to Vdd, and a wave forming unit 72 that is constructed with inverters 61, 62.

The drain of the NMOS transistor 45 is connected to the external power-supply voltage Vdd, and the boosted power-supply voltage (first power supply voltage) Vpp is applied to its gate. Also, the source is connected to the power-supply terminal of an inverter 46, and supplies the drive voltage (second power supply voltage) Vdd2 to the delay time generator 70.

In this case, the drive voltage Vdd2 of the delay time generator 70 becomes equal to the external power-supply voltage Vdd when the sum of the external power-supply voltage Vdd and the threshold voltage Vth of the NMOS transistor 45 is less than the boosted power-supply voltage Vpp. On the other hand, when the sum of the external power-supply voltage Vdd and the threshold voltage Vth becomes greater than the boosted power-supply voltage Vpp, the drive voltage Vdd2 is a value less than the boosted power-supply voltage Vpp by the threshold voltage Vth. That is:

when $Vdd+Vth<Vpp$, then $Vdd2=Vdd$, and when $Vdd+Vth \geq Vpp$, then $Vdd2=Vpp-Vth$ The relationship between the external power-supply voltage Vdd and the boosted power-supply voltage Vpp is shown in FIG. 3C as mentioned above.

In the delay circuit 1 of this embodiment, when the drive voltage Vdd2 becomes a maximum (Vdd2=Vpp−Vth), the delay time (t1+t2) is set to the value of the minimum required interval WL–LE.

Therefore, normally when the external power-supply voltage Vdd is less than the boosted power-supply voltage Vpp as shown in FIG. 3C, the drive voltage Vdd2=Vdd, and the delay time (t1+t2) becomes longer than the value corresponding to when Vdd2=Vpp−Vth. Moreover, together with being possible to sufficiently maintain the required interval WL–LE, a low drive voltage is applied to the inverter 46 so that the life of the inverter 46 is not shortened.

On the other hand, when the external power-supply voltage Vdd is greater than the boosted power-supply voltage Vpp, then the drive voltage Vdd2 is limited to the value Vpp−Vth as shown in FIG. 3C, and the delay time (t1+t2) does not become shorter than the set value mentioned above. Moreover, together with being possible to maintain the required interval WL–LE, the boosted power supply voltage Vpp is applied to the gate of the NMOS transistor 45, so power consumption of the boost-up circuit 6 does not increase.

In this way, the delay circuit 1 of this embodiment makes it possible to activate the sense amp 3 at the proper timing when a very small potential difference occurs between the bit lines BL,/BL sufficiently, regardless of how the external power-supply voltage Vdd fluctuates, and the delay time (t1+t2) does not become shorter then the required interval WL–LE.

Figure 6:
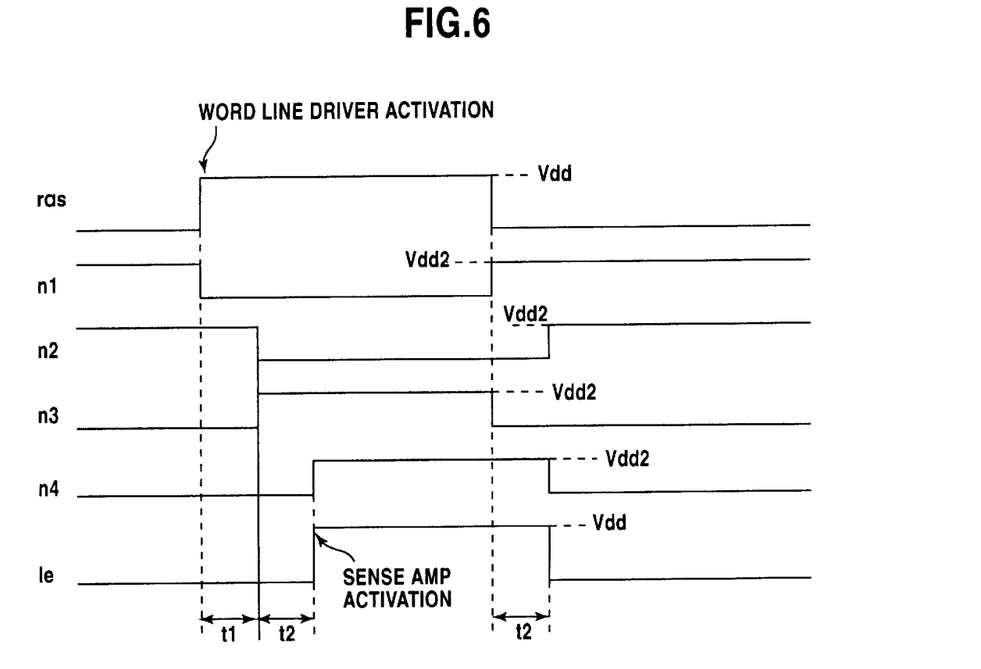
FIG. 6 is a timing chart for operation of the delay circuit of this invention.

FIG. 6 is a timing chart of the operation of the delay circuit 1 of this embodiment. When the row address strobe 'ras' is low (L level), nodes n1 and n2 are made high (H level) by the inverters 46, 47, 49, and nodes n3 and n4 are inverted by the NOR circuit 51 and become low (L level). Also, the NMOS transistor 60 of the level converter 71 conducts so node n5 becomes low (L level), and the latch enable signal 'le' that is supplied to the sense amp activation circuit 2 becomes low (L level). When this happens, the word-line driver 4 and sense amp 3 are both inactive.

When the row address strobe 'ras' becomes high (H level), the word-line driver 4 is activated and the potential of the word line rises. On the other hand, when the row address strobe 'ras' is inverted by the inverter 46 of the delay circuit 1, node n1 becomes low (L level). The signal at node 1 is delayed by the time t1 at the inverters 47, 49 and capacitors 48, 50, to become the signal at node n2, and together with the signal at node n1, it is input to the NOR circuit 51 and becomes the signal at node n3.

The signal at node n3 is further delayed by the time t2 at the inverters 52, 54 and capacitors 53, 55, and becomes the signal at node n4. The signal at node n4 is input at the gate of the NMOS transistor 58 of the level converter 71, and it is inverted by the inverter 56 and then input at the gate of the NMOS transistor 60. The signal level of the row address strobe 'ras' is the external power-supply voltage Vdd, however the signal level at nodes n1 to n4 is Vdd2.

The level converter 71, in order to match the signal level of the sense amp activation circuit 2 of next stage, converts the signal level of the delay time generator 70 to the external power-supply voltage Vdd. The signal at node n5 has the same timing as the signal at node n4, and they are formed by the inverters 61, 62 to become the latch enable signal 'le' of the external power-supply voltage Vdd.

Figure 7:
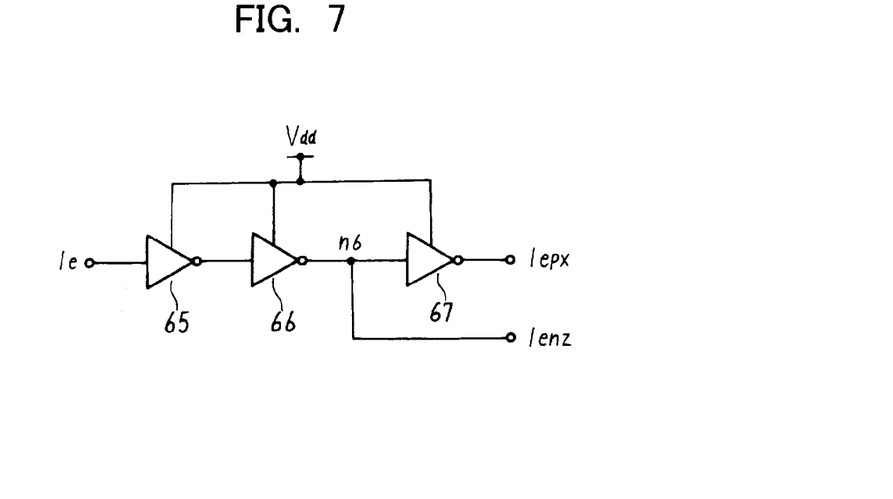
FIG. 7 is a schematic diagram of the sense amp activation circuit of this invention.

FIG. 7 is a schematic diagram of a sense amp activation circuit 2 of this embodiment. Sense amp activation circuit 2 of this embodiment is constructed with inverters 65, 66, 67, and outputs a sense amp activation signal 'lenz', that is in phase with the latch enable signal 'le' that is input from the delay circuit 1, and one that has the opposite phase 'lepx', and activates the sense amp 3.

Figure 8:
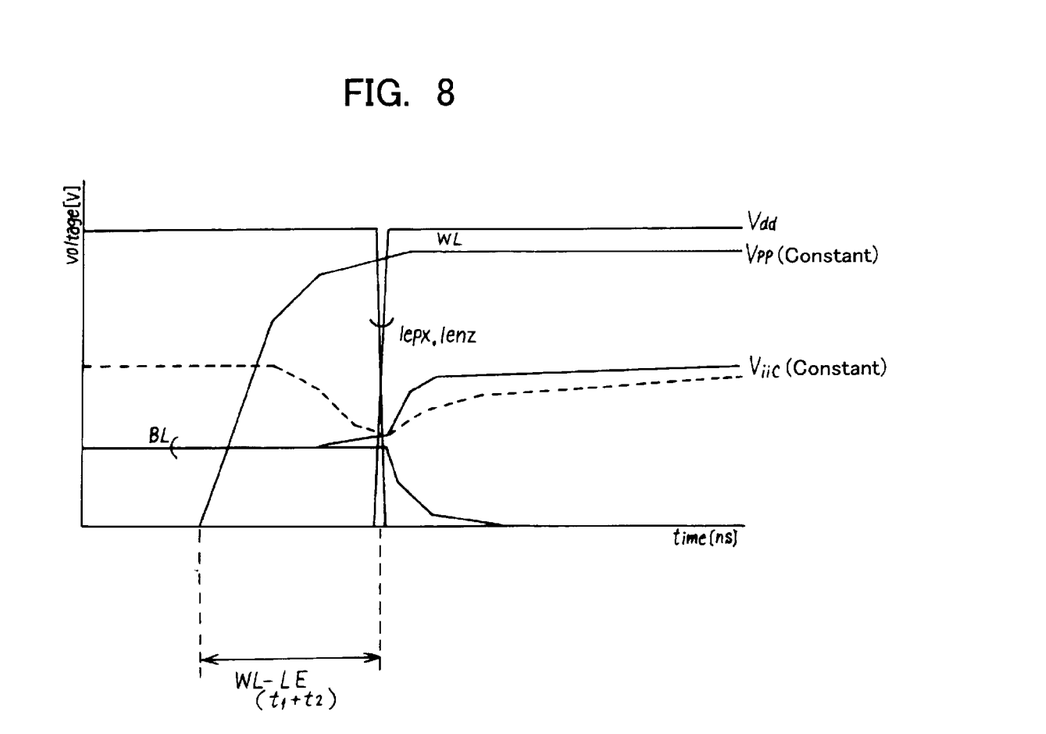
FIG. 8 is a diagram which shows the waveform of the memory cell of this invention.

FIG. 8 is a diagram showing the operation waveform of the memory cell 5 when the external power-supply voltage Vdd is larger than the boosted power-supply voltage Vpp. When the row address strobe, 'ras' is input, the potential of the word line WL rises. As mentioned above, the boosted power-supply voltage Vpp is applied to the word line WL, so the potential of the word line WL rises with a slope that corresponds to the voltage level of the boosted power-supply voltage Vpp.

When the potential of the word line WL rises, the NMOS transistor 7 of the memory cell 5 conducts, and the charge that is held by the capacitor 8 is discharged to the bit line BL. The dotted line shows the change in the charge voltage of the capacitor 8. As the charge held by the capacitor 8 is discharged, a potential difference between the bit lines BL,/BL begins to occur. When this happens, the slope of the rise in potential of the bit lines BL,/BL depends on the cell step-down power-supply voltage Viic that is applied to the memory cell 5 by way of the sense amp 3.

After the potential of the word line has risen, the sense amp activation signals 'lenz', 'lepx' are input to the sense amp 3 at the timing when there is sufficient potential difference between the bit lines BL,/BL. This interval WL–LE is set by the delay time (t1+t2) of the delay circuit 1.

The drive voltage Vdd2 is applied to the delay time generator 70 of the delay circuit 1 of this embodiment. As described above, this drive voltage Vdd2 is kept at a value equal or less than Vpp−Vth (Vth is the threshold voltage of the NMOS transistor 45) even when the external power-supply voltage Vdd becomes larger than the boosted power-supply voltage Vpp, and the delay time (t1+t2) of the delay circuit 1 does not become shorter than the time corresponding to Vpp−Vth.

In addition, it is possible to maintain the interval WL–LE required for memory operation and to activate the sense amp 3 at the proper timing in order to perform accurate memory operation, regardless of fluctuations in the external power-supply voltage Vdd.

The boost-up circuit 6 of this embodiment is constructed such that it supplies a constant boosted power-supply voltage Vpp, however, it is possible that the set value of the boosted power-supply voltage Vpp may shift due to variations in the manufacturing process. The slope of the potential rise of the word line WL depends on the boosted power-supply voltage Vpp, so when the boosted power-supply voltage Vpp becomes high, the time required for the potential of the word line WL to rise becomes shorter, and when the boosted power-supply voltage Vpp becomes low, the time required for the potential of the word line WL to rise becomes longer.

On the other hand, as mentioned above, the delay time (t1+t2) of the delay circuit 1 of this embodiment also depends of the voltage level of the boosted power-supply voltage Vpp. Therefore, when the boosted power-supply voltage Vpp becomes high, the time required for the potential of the word line WL to rise becomes shorter, the time that the data of the memory cell 5 is transmitted on the bit line BL becomes quicker, and the delay time (t1+t2) also becomes shorter, and when the boosted power-supply voltage Vpp becomes low, the time required for the potential of the word line WL to rise becomes longer, the time that the data of the memory cell 5 is transmitted on the bit line BL becomes slower, and the delay time (t1+t2) becomes longer.

Moreover, even when the set level of the boosted power-supply voltage Vpp shifts, it is possible to maintain the required interval VL–LE, and it is possible to activate the sense amp 3 at the proper timing, regardless of fluctuations of the external power-supply voltage Vdd.

With the present invention constructed as described above, the timing for activating the sense amp is not sped up due to fluctuations of the external power-supply voltage, and it is possible to maintain the required interval WL–LE, and thus it is possible to perform memory operation properly without increasing the power consumption of the memory device.

What is claimed is:

1. A memory device comprising:
   memory cells provided at cross sections of word lines and bit lines;
   a word-line driver receiving a first power-supply voltage for driving the word lines in response to a first activation signal;
   a delay circuit receiving a second power-supply voltage for generating a second activation signal that delays the first activation signal;
   and a sense amplifier for amplifying the voltage read from the memory cell in response to the second activation signal;
   wherein the second power-supply voltage is generated from the first power-supply voltage.

2. The memory device of claim 1, wherein said first power-supply voltage is generated by boosting up the external power-supply voltage.

3. The memory device of claim 1, wherein said second power-supply voltage is generated by a transistor in which an external power-supply voltage is supplied to its drain and said first power supply is supplied to its gate.

4. The memory device of claim 2, wherein the delay time of he delay circuit substantially depends on the second power-supply voltage, regardless of the variation of the external power-supply voltage.

5. The memory device of claim 3, wherein the delay circuit includes a series of inverters and capacitors, said inverters being supplied with the second power-supply voltage as the power-supply thereof.

6. The memory device of claim 4, wherein the delay circuit further includes a voltage level converter for converting the voltage level of the output of the series of inverters and capacitors into the external power-supply voltage level.

* * * * *